United States Patent
Ohno et al.

(10) Patent No.: US 7,632,695 B2
(45) Date of Patent: Dec. 15, 2009

(54) SEMICONDUCTOR DEVICE MANUFACTURING METHOD

(75) Inventors: Akihito Ohno, Tokyo (JP); Masayoshi Takemi, Tokyo (JP); Nobuyuki Tomita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 5 days.

(21) Appl. No.: 11/941,195

(22) Filed: Nov. 16, 2007

(65) Prior Publication Data

US 2008/0070387 A1 Mar. 20, 2008

Related U.S. Application Data

(62) Division of application No. 11/252,734, filed on Oct. 19, 2005, now abandoned.

(30) Foreign Application Priority Data

Oct. 27, 2004 (JP) ............................ 2004-311973
Sep. 15, 2005 (JP) ............................ 2005-267952

(51) Int. Cl.
*H01L 21/00* (2006.01)
(52) U.S. Cl. .................. 438/32; 438/36; 438/41
(58) Field of Classification Search .............. 438/32, 438/36, 41
See application file for complete search history.

(56) References Cited

U.S. PATENT DOCUMENTS

| | | | | |
|---|---|---|---|---|
| 6,252,255 B1 * | 6/2001 | Ueta et al. | ............... | 257/94 |
| 6,841,274 B2 * | 1/2005 | Ueno et al. | ............... | 428/698 |
| 7,462,882 B2 * | 12/2008 | Ueta et al. | ............... | 257/103 |
| 7,498,608 B2 * | 3/2009 | Ito et al. | ............... | 257/98 |
| 7,579,627 B2 * | 8/2009 | Ueta et al. | ............... | 257/79 |
| 2001/0030329 A1 * | 10/2001 | Ueta et al. | ............... | 257/103 |
| 2003/0001238 A1 * | 1/2003 | Ban | ............... | 257/627 |
| 2005/0042787 A1 * | 2/2005 | Ito et al. | ............... | 438/41 |
| 2005/0141577 A1 * | 6/2005 | Ueta et al. | ............... | 372/43 |
| 2006/0202188 A1 * | 9/2006 | Ueta et al. | ............... | 257/14 |
| 2009/0011530 A1 * | 1/2009 | Ito et al. | ............... | 438/32 |
| 2009/0236585 A1 * | 9/2009 | Ueta et al. | ............... | 257/14 |

FOREIGN PATENT DOCUMENTS

| | | |
|---|---|---|
| JP | 2000-82676 | 3/2000 |
| JP | 2000-223743 | 8/2000 |
| JP | 2001-322899 | 11/2001 |
| JP | 2003-60318 | 2/2003 |
| JP | 2003-327497 | 11/2003 |
| JP | 2004-87565 | 3/2004 |
| JP | 2004-104089 | 4/2004 |
| JP | 2004-146420 | 5/2004 |
| JP | 2004-327655 | 11/2004 |

* cited by examiner

*Primary Examiner*—Laura M Menz
(74) *Attorney, Agent, or Firm*—Leydig, Voit & Mayer, Ltd.

(57) ABSTRACT

A technique is provided which enables formation of nitride semiconductor layers with excellent flatness and excellent crystallinity on a gallium nitride substrate (GaN substrate), while improving the producibility of the semiconductor device using the GaN substrate. A gallium nitride substrate is prepared which has an upper surface having an off-angle of not less than 0.1° nor more than 1.0° in a <1-100> direction, with respect to a (0001) plane. Then, a plurality of nitride semiconductor layers including an n-type semiconductor layer are stacked on the upper surface of the gallium nitride substrate to form a semiconductor device such as a semiconductor laser.

6 Claims, 5 Drawing Sheets

F I G . 5
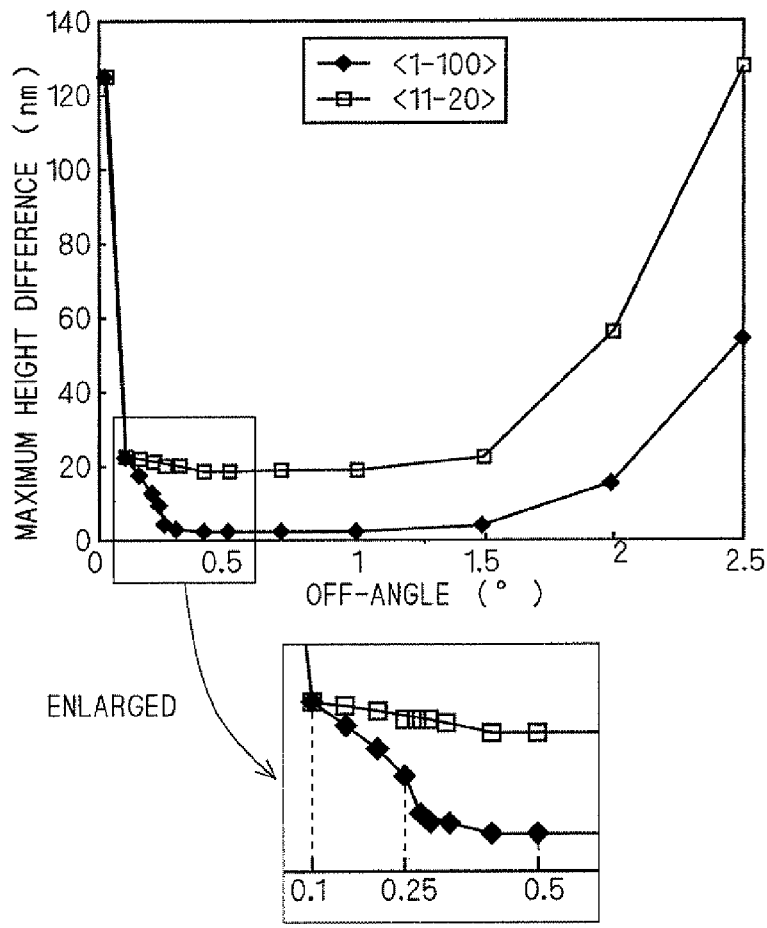
F I G . 6
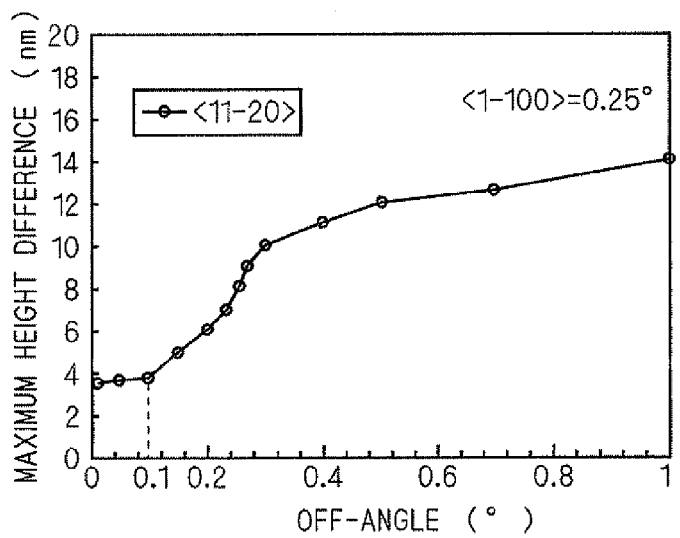

SEMICONDUCTOR DEVICE MANUFACTURING METHOD

BACKGROUND OF THE INVENTION

1. Field of the Invention

The present invention relates to a semiconductor device having a nitride semiconductor layer formed on a gallium nitride (GaN) substrate, and to a method for manufacturing the semiconductor device.

2. Description of the Background Art

Nitride semiconductors, such as gallium nitride, are utilized and studied for light emitting devices and other electronic devices, and blue light emitting diodes and green light emitting diodes making use of the properties of nitride semiconductors are already in practical use. Also, blue-violet semiconductor lasers employing nitride semiconductors are being developed as next-generation high-density optical disk light sources.

Conventionally, the fabrication of light emitting devices with nitride semiconductors mainly uses sapphire substrates. However, the lattice mismatch between the sapphire substrates and nitride semiconductors formed thereon is as large as about 13%, so that a high density of defects, such as dislocations, are produced in the nitride semiconductors, making it difficult to obtain nitride semiconductors of high quality.

Recently, gallium nitride substrates (hereinafter referred to as GaN substrates) with low defect density are developed, and studies and developments are being intensively made for applications of the GaN substrates. The GaN substrates are chiefly intended for use as semiconductor laser substrates.

When a nitride semiconductor is grown on a GaN substrate, there is a problem that good crystallinity is not obtained when the nitride semiconductor is grown on a C-plane, i.e., on a (0001) surface. To solve this problem, Japanese Patent Application Laid-Open No. 2000-223743 discloses a technique for improving the crystallinity of, and lengthening the life of, a nitride semiconductor light emitting device formed on a GaN substrate, in which the upper surface of the GaN substrate is inclined at an angle of not less than 0.03° nor more than 10° with respect to the C-plane.

Techniques for manufacturing semiconductor devices using nitride semiconductors are also disclosed in Japanese Patent Application Laid-Open Nos. 2000-82676 and 2003-60318, for example.

Now, in the fabrication of a semiconductor device such as a semiconductor laser using a GaN substrate, it is desired that the nitride semiconductor layers formed on the GaN substrate present not only good crystallinity but also superior surface flatness. However, when nitride semiconductor layers are grown on a GaN substrate by utilizing the technique of Japanese Patent Application Laid-Open No. 2000-223743, the nitride semiconductor layers may exhibit unsatisfactory surface flatness, and may even fail to ensure sufficient crystallinity. This causes the semiconductor device fabricated with the nitride semiconductor layers to exhibit deteriorated electric characteristics and reduced reliability. Also, it is not preferable to greatly incline the upper surface of the GaN substrate from the viewpoint of manufacture of the semiconductor devices.

SUMMARY OF THE INVENTION

An object of the present invention is to provide a technique which enables formation of a nitride semiconductor layer with excellent flatness and excellent crystallinity on a GaN substrate, while improving the producibility of the semiconductor device using the GaN substrate.

According to the present invention, a semiconductor device includes a gallium nitride substrate and a nitride semiconductor layer that is formed on the upper surface of the gallium nitride substrate. The upper surface of the gallium nitride substrate has an off-angle of not less than 0.1° nor more than 1.0° in a <1-100> direction, with respect to a (0001) plane.

Also, according to the present invention, a semiconductor device manufacturing method includes the steps (a) and (b). The step (a) is a step of preparing a gallium nitride substrate whose upper surface has an off-angle of not less than 0.1° nor more than 1.0° in a <1-100> direction with respect to a (0001) plane. The step (b) is a step of forming a nitride semiconductor layer on the upper surface of the gallium nitride substrate.

Thus, the upper surface of the gallium nitride substrate has an off-angle of not less than 0.10 nor more than 1.0° in the <1-100> direction with respect to the (0001) plane. This enables formation of a nitride semiconductor layer with excellent flatness and excellent crystallinity on the gallium nitride substrate, while improving the producibility of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram showing a relation between an off-angle of the upper surface of the gallium nitride substrate and maximum height difference on the surface of a nitride semiconductor layer;

FIG. 6 is a diagram showing a relation between an off-angle in the <11-20> direction of the upper surface of the gallium nitride substrate and maximum height difference on the upper surface of the nitride semiconductor layer, where the upper surface of the gallium nitride substrate has an off-angle in the <1-100> direction;

DESCRIPTION OF THE PREFERRED EMBODIMENTS

Figure 1:
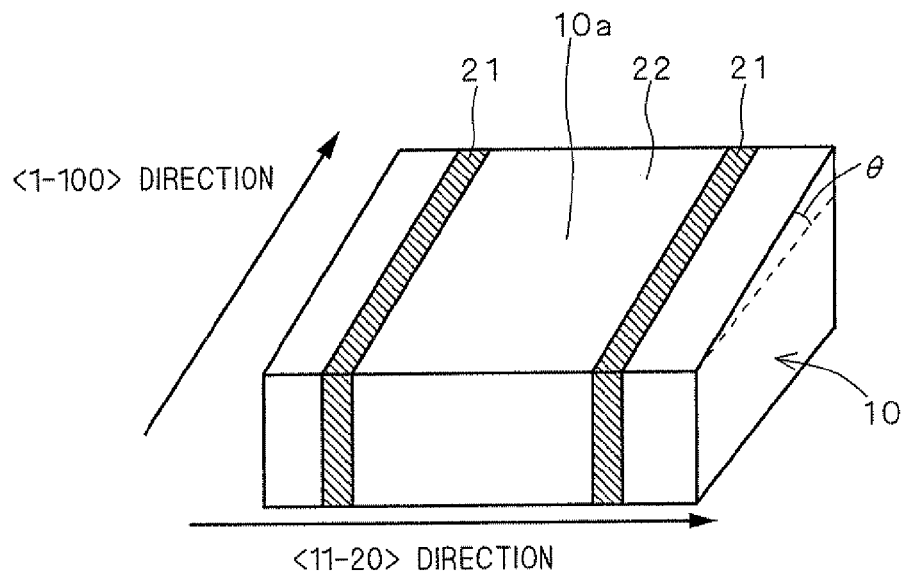
FIG. 1 is a perspective view illustrating the structure of a gallium nitride substrate according to a preferred embodiment of the present invention.

FIG. 1 is a perspective view illustrating the structure of a GaN substrate 10 according to a preferred embodiment of the present invention. The GaN substrate 10 of the preferred embodiment has a hexagonal crystal structure. The GaN substrate 10 is used to produce semiconductor devices such as light emitting devices, e.g., semiconductor lasers and light emitting diodes, or high-frequency electronic devices.

As shown in FIG. 1, the upper surface 10a of the GaN substrate 10 has an off-angle θ in the <1-100> direction with respect to the C-plane, i.e., the (0001) plane. Accordingly, the upper surface 10a of the GaN substrate 10 is parallel to a plane that is obtained by rotating a plane parallel to the C-plane by the off-angle θ around a rotation axis extending in the <11-20> direction that is normal to the <1-100> direction and parallel to the C-plane. In the preferred embodiment, the off-angle θ is set to be not less than 0.1° nor more than 1.0°.

In general, in the surface of a GaN substrate, such as the GaN substrate 10 of the preferred embodiment, high dislocation density regions 21 and low dislocation density regions 22 form alternately in the <11-20> direction as shown in FIG. 1. Usually, the low dislocation density regions 22 are employed to form semiconductor devices with the GaN substrate.

Figure 2:
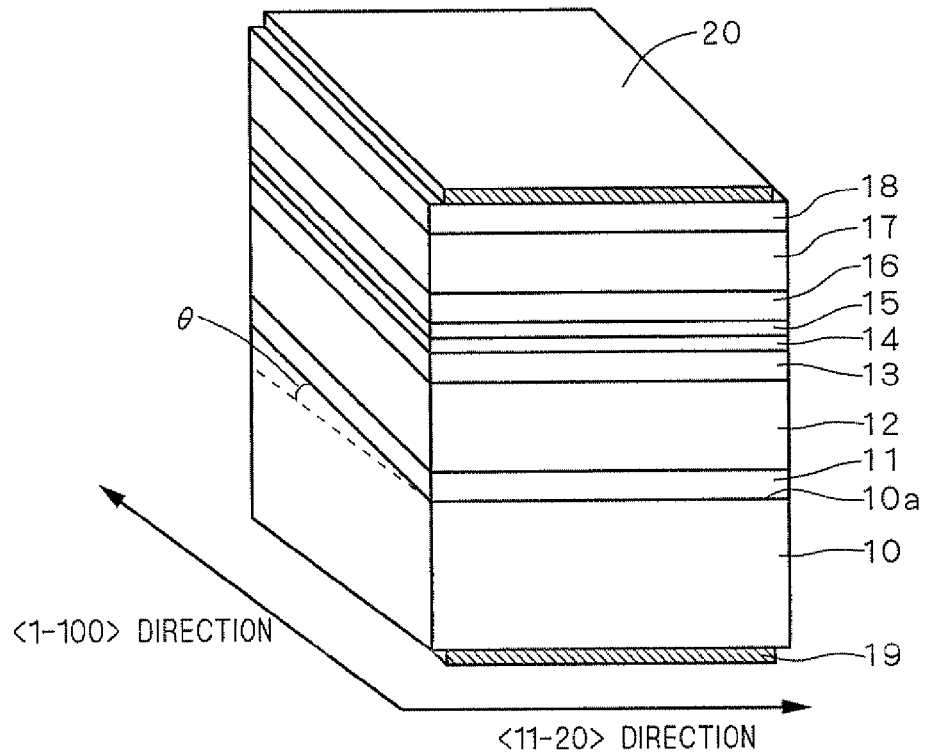
FIG. 2 is a perspective view illustrating the structure of a semiconductor device according to the preferred embodiment of the present invention.

Next, an example of a semiconductor device manufactured using the GaN substrate 10 will be described. FIG. 2 is a perspective view showing the structure a nitride semiconductor laser manufactured using the GaN substrate 10. As shown in FIG. 2, a plurality of nitride semiconductor layers are stacked over the upper surface 10a of the GaN substrate 10. Specifically, the stacked structure on the upper surface 10a of the GaN substrate 10 includes an n-type semiconductor layer 11, an n-type cladding layer 12, an n-type optical guide layer 13, a multiple quantum well (MQW) active layer 14, a p-type electron barrier layer 15, a p-type optical guide layer 16, a p-type cladding layer 17, and a p-type contact layer 18, which are stacked in this order. Also, an n-electrode 19 is provided on the bottom surface of the GaN substrate 10 and a p-electrode 20 is provided on the top surface of the p-type contact layer 18.

The n-type semiconductor layer 11 has a thickness of 1.0 μm and is formed of n-type GaN or n-type aluminum gallium nitride (AlGaN), for example. The n-type cladding layer 12 has a thickness of 1.0 μm and is formed of n-type $Al_{0.07}Ga_{0.93}N$, for example. The n-type optical guide layer 13 has a thickness of 0.1 μm and is formed of n-type GaN, for example. The multiple quantum well active layer 14 has a multiple quantum well structure including an alternate stack of well layers having a thickness of 3.5 nm and formed of indium gallium nitride ($In_{0.12}Ga_{0.88}N$) and barrier layers having a thickness of 7.0 nm and formed of GaN, for example.

The p-type electron barrier layer 15 has a thickness of 0.02 μm and is formed of p-type $Al_{0.2}Ga_{0.8}N$, for example. The p-type optical guide layer 16 has a thickness of 0.1 μm and is formed of p-type GaN, for example. The p-type cladding layer 17 has a thickness of 0.4 μm and is formed of p-type $Al_{0.07}Ga_{0.93}N$, for example. The p-type contact layer 18 has a thickness of 0.1 μm and is formed of p-type GaN, for example.

The nitride semiconductor laser constructed as above according to the preferred embodiment is cleaved in (1-100) surfaces and has resonator mirrors in the (1-100) surfaces. Application of voltage between the n-electrode 19 and the p-electrode 20 causes the multiple quantum well active layer 14 to output a laser beam.

Figure 3:
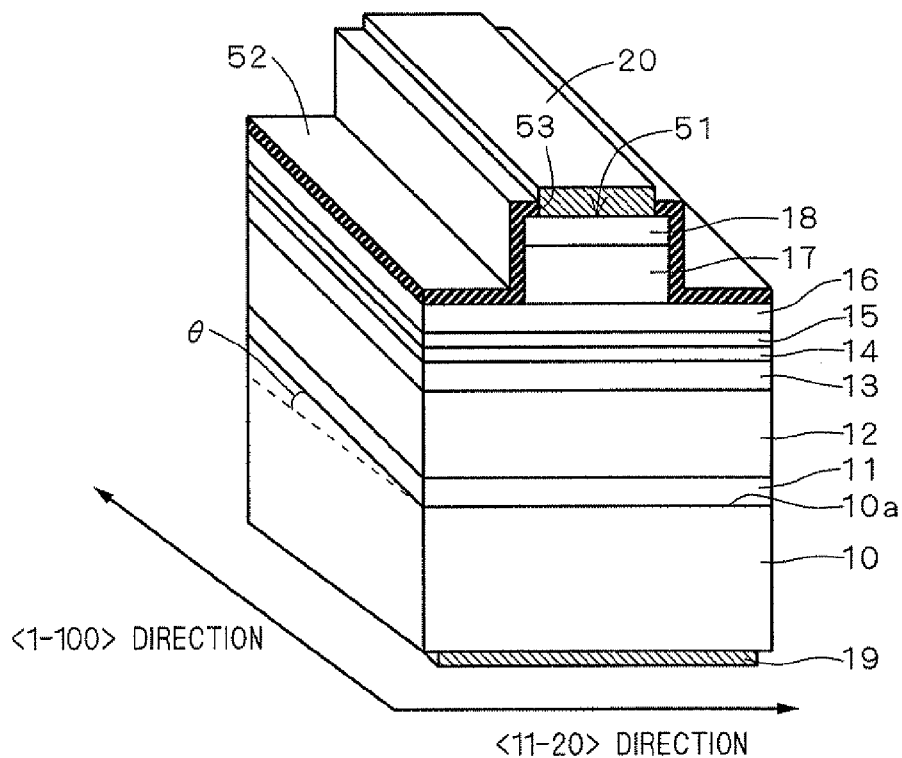
FIG. 3 is a perspective view illustrating a modification of the structure of the semiconductor device according to the preferred embodiment of the present invention.

FIG. 3 is a perspective view showing a modification of the semiconductor laser structure of the preferred embodiment. The semiconductor laser shown in FIG. 3 is a ridge waveguide type semiconductor laser, in which the semiconductor laser of FIG. 1 is modified by changing the shapes of the p-type cladding layer 17, p-type contact layer 18, and p-electrode 20 and by adding silicon oxide films 52. A method of manufacturing the semiconductor laser of FIG. 3 will be described below.

While the crystal growth of the nitride semiconductor layers, including the n-type semiconductor layer 11, the n-type cladding layer 12, and so on, may be achieved by metal-organic chemical vapor deposition (MOCVD), molecular beam epitaxy (MBE), or hydride vapor phase epitaxy (HVPE), the example below uses the MOCVD method. The process uses trimethyl gallium (hereinafter referred to as TMG), trimethyl aluminum (hereinafter referred to as TMA), or trimethyl indium (hereinafter referred to as TMI) as Group III material, and uses an ammonia ($NH_3$) gas as Group V material. Also, the process uses monosilane ($SiH_4$) as n-type impurity material and uses scyclo-pentadienyl magnesium ($CP_2Mg$) as p-type impurity material, for example. Hydrogen ($H_2$) gas and nitrogen ($N_2$) gas are used as carrier gas for carrying the material gases.

Figure 4:
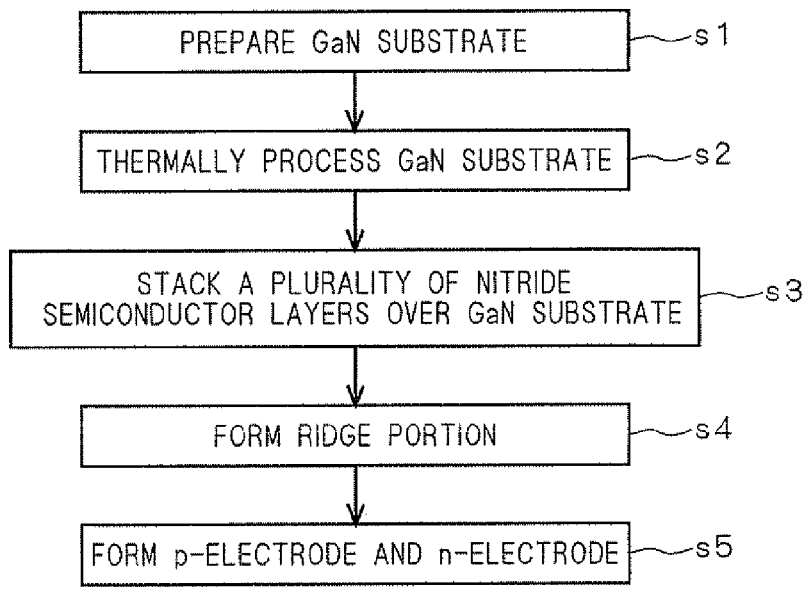
FIG. 4 is a flowchart showing a semiconductor device manufacturing method according to the preferred embodiment of the present invention.

FIG. 4 is a flowchart showing a method of manufacturing the semiconductor laser shown in FIG. 3. First, in step s1, the GaN substrate 10 shown in FIG. 1, having an off-angle θ of 0.5°, for example, is prepared. Then, in step s2, the GaN substrate 10 is thermally processed. In the step s2, first, the GaN substrate 10 is placed in an MOCVD apparatus. Next, the temperature in the apparatus is raised to 1000° C., with supply of $NH_3$ gas into the apparatus. After the temperature rise, a mixed gas of $NH_3$ gas, $N_2$ gas, and $H_2$ gas is supplied into the apparatus, and the GaN substrate 10 is thermally processed for 15 minutes in the mixed gas atmosphere. In this process step, the percentage of the $H_2$ gas in the mixed gas is set at 5%, for example.

Next, in step s3, the plurality of nitride semiconductor layers, including the n-type semiconductor layer 11 etc., are formed on the GaN substrate 10. In the step s3, first, a TMG gas and a $SiH_4$ gas are supplied into the MOCVD apparatus, so as to grow the n-type GaN semiconductor layer 11 on the upper surface 10a of the GaN substrate 10. Then, supply of a TMA gas is started so as to grow the n-type $Al_{0.07}Ga_{0.93}N$ cladding layer 12 on the n-type semiconductor layer 11.

Next, the supply of TMA gas is stopped and the n-type GaN optical guide layer 13 is grown on the n-type cladding layer 12. Subsequently, the supply of TMG gas and $SiH_4$ gas is stopped and the temperature in the apparatus is decreased to 700° C. Then, the multiple quantum well active layer 14 is grown on the n-type optical guide layer 13. Specifically, TMG gas, TMI gas, and $NH_3$ gas are supplied to grow an $In_{0.12}Ga_{0.88}N$ well layer, and TMG gas and $NH_3$ gas are supplied to grow a GaN barrier layer. This process is repeated to form the multiple quantum well active layer 14 having three pairs of well and barrier layers.

Subsequently, the temperature in the apparatus is again raised to 1000° C. with supply of $NH_3$ gas, and then supply of TMS gas, TMA gas, and $CP_2Mg$ gas is started, so as to grow the p-type $Al_{0.2}Ga_{0.8}N$ electron barrier layer 15 on the multiple quantum well active layer 14. Next, the supply of TM gas is stopped and the p-type GaN optical guide layer 16 is grown on the p-type electron barrier layer 15. Next, the supply of TMA gas is restarted, so as to grow the 0.4-μm-thick p-type $Al_{0.07}Ga_{0.93}N$ cladding layer 17 on the p-type optical guide layer 16.

Next, the supply of TMA gas is stopped and the 0.1-μm-thick p-type SaN contact layer 18 is grown on the p-type cladding layer 17. Then, the supply of TMG gas and CP$_2$Mg gas is stopped and the temperature in the apparatus is decreased to room temperature.

In this way, all nitride semiconductor layers have been grown and the step s3 is completed, and then the ridge portion 51 serving as an optical waveguide is formed in step s4. In the step s4, first, resist is applied to the entire wafer surface and a lithography process is performed to form a given resist pattern that corresponds to the shape of the mesa area. Using the resist pattern as a mask, the p-type contact layer 18 and the p-type cladding layer 17 are sequentially etched by, e.g., reactive ion etching (ICE). The ridge portion 51 as an optical waveguide is thus formed. A chlorine-based gas is used as the etching gas, for example.

Next, in step s5, the p-electrode 20 and the n-electrode 19 are formed. In the step s5, first, without removing the resist pattern used as a mask in the step s4, a silicon oxide film (SiO$_2$ film) 52, e.g., 0.2 μm thick, is formed on the entire wafer surface by CVD, vacuum evaporation, or sputtering, and the portion of the silicon oxide film 52 located on the ridge portion 51 is removed together with the resist pattern. This process is called "lift-off". An opening 53, for exposure of the ridge portion 51, is thus formed in the silicon oxide film 52.

Next, a metal film of platinum (Pt) and a metal film of gold (Au) are sequentially formed on the entire wafer surface by, e.g., vacuum evaporation, which is followed by resist application and lithography, and then by wet-etching or dry-etching, so as to form the p-electrode 20 in the opening 53.

Subsequently, a metal film of titanium (Ti) and a metal film of aluminum (Al) are sequentially formed on the entire bottom surface of the GaN substrate 10 by, e.g., vacuum evaporation, and the formed stacked films are etched to form the n-electrode 19. Then, an alloy process is performed to cause the n-electrode 19 to be in ohmic contact with the GaN substrate 10.

The structure thus formed is processed into bar-shape, e.g., by cleavage, and both resonator facets are formed on the structure. Then, the resonator facets are coated and the bar-shaped structure is separated into chips by, e.g., cleavage. The semiconductor laser shown in FIG. 3 is thus completed.

As described so far, in the preferred embodiment, the upper surface 10a of the GaN substrate 10 has an off-angle θ of 0.1° or more in the <1-100> direction with respect to the (0001) plane, which improves the flatness and crystallinity of the n-type semiconductor layer 11 formed on the upper surface 10a. This improves electric characteristics and reliability of the semiconductor device of the preferred embodiment that is manufactured using the n-type semiconductor layer 11.

Figure 9:
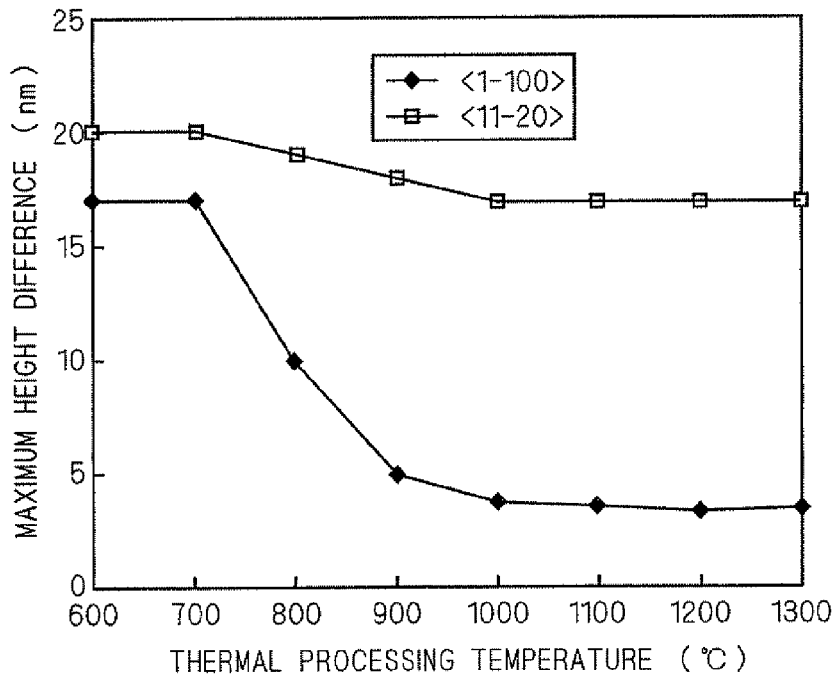
FIG. 9 is a diagram showing a relation between the temperature of thermal processing to the gallium nitride substrate and maximum height difference on the upper surface of the gallium nitride substrate.
Figure 10:
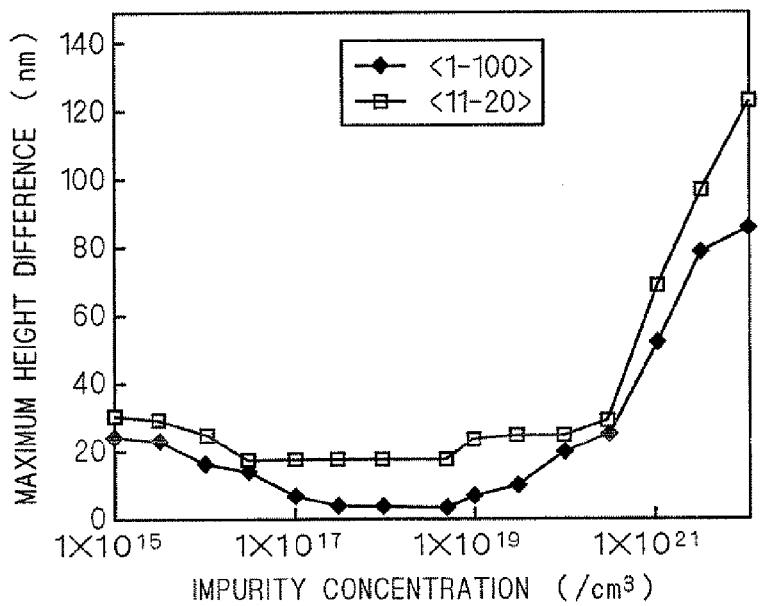
FIG. 10 is a diagram showing a relation between impurity concentration of a nitride semiconductor layer and maximum height difference on the upper surface of the nitride semiconductor layer.

FIG. 5 is a diagram showing a relation between the off-angle θ of the upper surface 10a of the GaN substrate 10 and maximum height difference on the upper surface of the n-type semiconductor layer 11 formed on the upper surface 10a. In FIG. 5, the lozenge marks show data obtained when the upper surface 10a of the GaN substrate 10 had the off-angle θ in the <1-100> direction as described in the preferred embodiment, and the square marks show data obtained when the upper surface 10a of the GaN substrate 10 had an off-angle θ in the <11-20> direction unlike in the preferred embodiment. In FIGS. 9 and 10 described later, the lozenge marks and square marks show data obtained in the same ways.

The maximum height difference shown on the vertical axis in FIG. 5 indicates values obtained by growing the n-type semiconductor layer 11 to a thickness of 4 μm and observing the surface of the n-type semiconductor layer 11 in an area of 200 μm×200 μm by atomic force microscopy (AFM). The same applies to FIGS. 6 and 10 described later.

As shown in FIG. 5, when the off-angle θ is 0.1° or more, the maximum height difference on the upper surface of the n-type semiconductor layer 11 is greatly reduced and good surface morphology is obtained. When the upper surface 10a of the GaN substrate 10 is inclined in the <1-100> direction, the maximum height difference of the n-type semiconductor layer 11 is further reduced when the off-angle θ is 0.25° or more, and the n-type semiconductor layer 11 provides good surface morphology. On the other hand, when the off-angle θ becomes larger than 1.0°, the maximum height difference on the upper surface of the n-type semiconductor layer 11 becomes larger as shown in FIG. 5.

When the off-angle θ is 0.05° or less, hexagonal hillocks occur on the surface of the n-type semiconductor layer 11, and then the surface roughness is increased and flat morphology is not obtained.

When the off-angle θ is not less than 0.05° and is less than 0.25°, step-like structures form along a direction normal to the direction of the off-angle θ, i.e., along a direction normal to the <1-100> direction or the <11-20> direction. However, when the off-angle θ is in the <1-100> direction, the step-like structures are reduced when the off-angle θ is 0.25° or more, and then flatter morphology is obtained. In this case, the mean surface roughness of the n-type semiconductor layer 11 is suppressed to 0.5 nm or less.

By contrast, when the off-angle θ is in the <11-20> direction, even when the off-angle θ is 0.25° or more, the high dislocation density regions 21 in the surface of the GaN substrate 10 shown in FIG. 1 hinder step flow growth, and then step-like structures remain and good surface morphology is not obtained. In the manufacture of the semiconductor laser shown in the preferred embodiment, for example, such surface roughness causes unevenness not only on the n-type semiconductor layer 11 but also on the multiple quantum well active layer 14, which leads to problems such as large loss in the laser resonator and deterioration of threshold current density.

As described above, the off-angle θ of the upper surface 10a of the GaN substrate 10 and its direction greatly affect the surface roughness and crystallinity of the grown layers formed on the upper surface 10a. When the semiconductor laser is formed on the upper surface 10a of the GaN substrate 10 that is inclined at 0.1° or more in the <1-100> direction as shown in the preferred embodiment, the semiconductor laser provides superior flatness and crystallinity and stable device characteristics. The flatness and crystallinity are further improved when the semiconductor laser is formed on the upper surface 10a of the GaN substrate 10 that is inclined at 0.25° or more in the <1-100> direction. The flatness and crystallinity are still further improved when the semiconductor laser is formed on the upper surface 10a of the GaN substrate 10 that is inclined at 0.3° or more in the <1-100> direction.

Also, the off-angle θ is set to be not more than 1.0° in the preferred embodiment, which improves the processability in the processing of the GaN substrate 10 for forming the off-angle θ, and which also facilitates formation of the plurality of nitride semiconductor layers stacked over the GaN substrate 10. This improves the producibility of the semiconductor device employing the GaN substrate 10.

Usually, a semiconductor laser has resonator mirrors in (1-100) surfaces, in which case a larger off-angle θ in the <1-100> direction causes increased mirror loss. Accordingly, setting the off-angle θ not more than 1.0° is preferable also from the viewpoint of mirror loss reduction of the semiconductor laser.

While the GaN substrate 10 shown in FIG. 1 has the off-angle θ only in the <1-100> direction, an off-angle θ1 may be formed also in the <11-20> direction. FIG. 6 shows a relation between the off-angle θ1 and maximum height difference on the upper surface of the n-type semiconductor layer 11 formed on the upper surface 10a of the GaN substrate 10, where the upper surface 10a has an off-angle θ of 0.25° in the <1-100> direction and the off-angle θ1 in the <11-20> direction.

Figure 7:
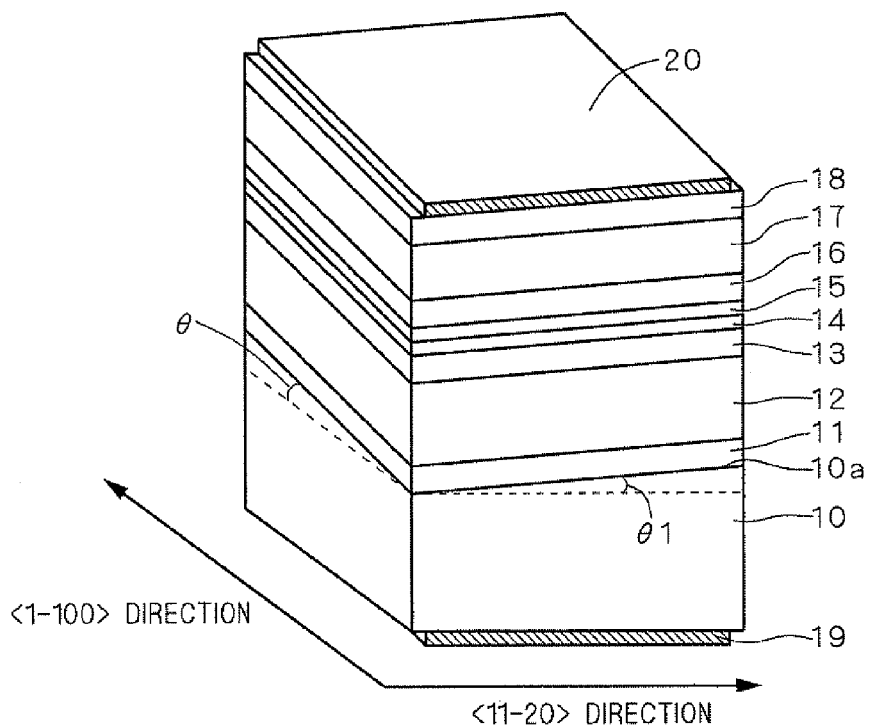
FIG. 7 is a perspective view illustrating a modification of the structure of the semiconductor device according to the preferred embodiment of the present invention.

As shown in FIG. 6, when the upper surface 10a of the GaN substrate 10 is inclined at 0.25° in the <1-100> direction and the off-angle θ1 in the <11-20> direction is not less than 0° nor more than 0.1°, the maximum height difference on the upper surface of the n-type semiconductor layer 11 remains almost unchanged and the n-type semiconductor layer 11 provides good surface morphology. While the results shown in FIG. 6 were obtained when the off-angle θ was 0.25°, similar results are obtained when the off-angle θ is not less than 0.25°. FIG. 7 shows the structure of a modification of the nitride semiconductor laser of FIG. 2, where the nitride semiconductor laser employs a GaN substrate 10 having the off-angle θ in the <1-100> direction and the off-angle θ1 in the <11-20> direction.

Figure 8:
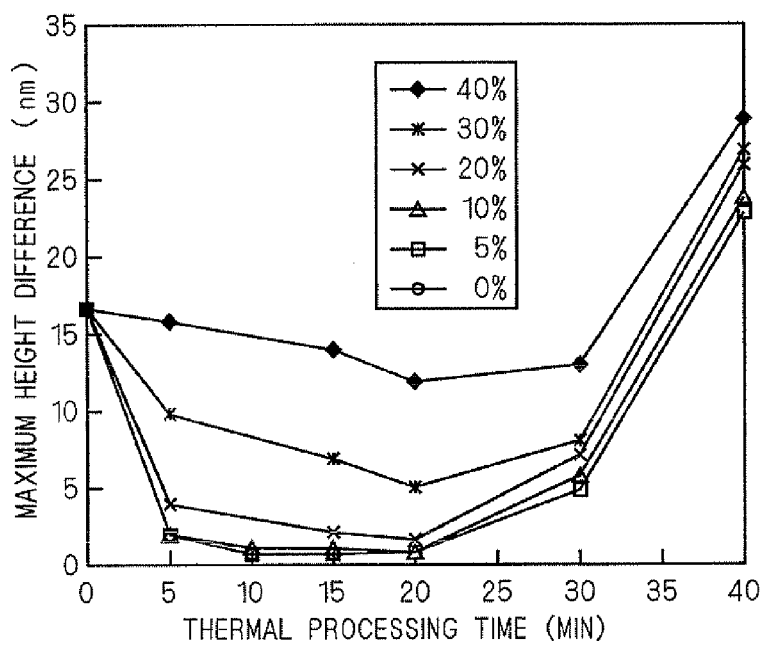
FIG. 8 is a diagram showing a relation between the time of thermal processing to the gallium nitride substrate and maximum height difference on the upper surface of the gallium nitride substrate.

FIG. 8 shows a relation between the maximum height difference on the upper surface 10a of the GaN substrate 10 and thermal processing time, where the GaN substrate 10 was thermally processed in a growth furnace at 1000° C. in a mixed gas atmosphere containing $NH_3$ gas, $N_2$ gas, and $H_2$ gas, or in a mixed gas atmosphere containing $NH_3$ gas and $N_2$ gas. FIG. 8 shows the percentage of the $H_2$ gas in the mixed gas as a parameter.

The circular marks in FIG. 8 show data obtained when the partial pressure of the $H_2$ gas was 0%, i.e., when the mixed gas contains no $H_2$ gas, and the square marks, triangle marks, x marks, * marks, and lozenge marks in FIG. 8 show data obtained when the partial pressure of $H_2$ gas was 5%, 10%, 20%, 30%, and 40%, respectively. The maximum height difference on the vertical axis in FIG. 8 shows values obtained by observing the upper surface 10a of the GaN substrate 10 by AFM in an area of 10 μm×10 μm. The same applies to FIG. 9 described later.

As shown in FIG. 8, in the step s2 described earlier, the roughness on the upper surface 10a of the GaN substrate 10 is greatly reduced when the thermal process is applied for 5 minutes or more with the partial pressure of $H_2$ gas of 30% or less.

Also, applying the thermal process for 10 minutes or more with the $H_2$ gas partial pressure of not less than 0% nor more than 10% reduces the roughness on the upper surface 10a of the GaN substrate 10 to 1 nm or less. When nitride semiconductor layers are formed over the upper surface 10a of the GaN substrate 10 that is inclined at 0.1° or more in the <1-100> direction as described in the invention, formation of roughness of 2 nm or more on the upper surface 10a of the GaN substrate 10 makes it difficult to maximally achieve the flatness and crystal quality improving effects. Accordingly, in order to certainly and maximally achieve the effects of the invention, it is very important to reduce the roughness on the upper surface 10a of the GaN substrate 10 to 1 nm or less by the thermal processing prior to the growth of the nitride semiconductor layers.

On the other hand, applying the thermal process to the GaN substrate 10 for a long time promotes decomposition of gallium nitride in the GaN substrate 10 and causes nitrogen to escape from the GaN substrate 10, which may result in poor improvement of the flatness of the upper surface 10a of the GaN substrate 10. It is known from FIG. 8 that the roughness on the upper surface 10a of the GaN substrate 10 rapidly increases when the thermal processing time exceeds 30 minutes. This shows that it is preferable to set the thermal processing time at 30 minutes or less in order to certainly improve the flatness of the GaN substrate 10.

As for the thermal processing temperature, similar effects are produced at temperatures of not less than 800° C. nor more than 1200° C. and the roughness on the upper surface 10a of the GaN substrate 10 is reduced. Setting the thermal processing temperature at 1000° C. or more and 1200° C. or less further reduces the roughness on the upper surface 10a of the GaN substrate 10. FIG. 9 shows a relation between the thermal processing temperature and the maximum height difference on the upper surface 10a of the GaN substrate 10, where the GaN substrate 10 was thermally processed for 5 minutes in a growth furnace in a mixed gas atmosphere containing $NH_3$ gas, $N_2$ gas, and $H_2$ gas, with the partial pressure of the $H_2$ gas set at 20%. As shown in FIG. 9, when the thermal processing temperature is 700° C. or less, almost no mass transportation of Ga atoms occurs in the upper surface 10a of the GaN substrate 10 and the roughness on the upper surface 10a is not reduced. However, the roughness on the upper surface 10a is greatly reduced when the thermal processing temperature is 800° C. or more. When the thermal processing temperature is 1000° C. or higher, the maximum height difference on the upper surface 10a of the GaN substrate 10 becomes still smaller. However, setting the thermal processing temperature higher than 1200° C. is not preferable because this considerably increases the load on the heater in the MOCVD apparatus and requires frequent replacement of the heater. Also, because the possibility of re-evaporation of nitrogen atoms from the upper surface 10a of the GaN substrate 10 exponentially increases with the heating temperature, performing the thermal process at a temperature higher than 1200° C. requires increasing the flow rate of $NH_3$ gas to prevent re-evaporation of nitrogen atoms, which is not preferable also from a producibility standpoint.

When the partial pressure of $H_2$ gas is 30% or less, migration of gallium (Ga) atoms is promoted in the GaN substrate 10 and the roughness on the upper surface 10a of the GaN substrate 10 is reduced.

When the partial pressure of $H_2$ gas is 30% or more, the thermal process exerts strong thermal etching to the substrate surface and so the roughness on the upper surface 10a of the GaN substrate 10 remains almost unchanged.

As above, the flatness of the upper surface 10a of the GaN substrate 10 is improved by, in the step s2, thermally processing the GaN substrate 10 for 5 minutes or more at not less than 800° C. nor more than 1200° C. in an atmosphere of a gas containing $NH_3$, or a gas containing $NH_3$ and $H_2$ with the $H_2$ percentage of 30% or less. This also improves the flatness of the nitride semiconductor layer formed over the upper surface 10a of the GaN substrate 10, and makes it possible to form a semiconductor device with good electric characteristics by using the nitride semiconductor layer.

Also, the flatness of the GaN substrate 10 is certainly improved by setting the thermal processing time not exceeding 30 minutes.

In the thermal processing of the GaN substrate 10, the $N_2$ gas contained in the mixed gas used in the example above functions as a carrier gas and hardly contributes to the improvement of the flatness of the upper surface 10a of the GaN substrate 10. Accordingly, the mixed gas does not necessary have to contain $N_2$ gas.

FIG. 10 is a diagram showing a relation between the impurity concentration of the n-type semiconductor layer 11 of the preferred embodiment and the maximum height difference on the upper surface of the n-type semiconductor layer 11. As shown in FIG. 10, when the impurity concentration of the n-type semiconductor layer 11 is not less than $1\times10^{16}$ cm$^{3}$ nor more than $1\times10^{20}$ cm$^{3}$, the maximum height difference on its upper surface is small and the n-type semiconductor layer 11 presents more improved surface morphology. When the impurity concentration of the n-type semiconductor layer 11 is not less than $1\times10^{7}$ cm$^{-3}$ nor more than $1\times10^{19}$ cm$^{-3}$, the maximum height difference on its upper surface is smaller than 10 nm and the n-type semiconductor layer 11 presents more improved surface morphology. When the impurity concentration of the n-type semiconductor layer 11 is not less than $1\times10^{17}$ cm$^{-3}$ nor more than $5\times10^{18}$ cm$^{-3}$, the maximum height difference on its upper surface is still smaller and the n-type semiconductor layer 11 presents still more improved surface morphology.

The present invention is applicable to other semiconductor light emitting devices as well as to semiconductor lasers, and also to other electronic devices.

As described so far, the present invention enables formation of a nitride semiconductor layer with good flatness and good crystallinity on a GaN substrate. The "crystallinity" herein means electric and optical characteristics of the crystal that result from the regularity of arrangement of atoms of the crystal, i.e., the structural regularity of the crystal. When the structural regularity is not ensured in a nitride semiconductor layer, abnormal structures independent of the flatness of the GaN substrate form in the nitride semiconductor layer. Such abnormal structures are roughly classified into irregular roughness on the surface of the nitride semiconductor layer, and surface configurations, called "hillocks", that have regularity reflecting the crystallographic symmetricalness of the substrate. Hillocks are substantially regarded as a kind of facets. The irregular roughness is formed because of insufficient surface migration of Group III atoms during crystal growth. Insufficient surface migration reduces the possibility that Group III atoms are positioned in the sites where Group III atoms should originally be positioned crystallographically. This deteriorates characteristics defined by microscopic structures on the atomic scale. Specifically, as for the electric characteristics, lattice defects such as vacancies and interstitial atoms reduce carrier mobility defined by carrier scattering possibility. Also, the optical characteristic is deteriorated because of formation of radiative recombination centers due to impurities. On the other hand, formation of facets induces microscopic anisotropy of the surface migration of Group III atoms. This causes spatial variations in thickness of the multiple quantum well active layer of the semiconductor laser. The variations, even on the nanometer scale, significantly affects the emission wavelength.

Accordingly, in order to obtain good semiconductor laser characteristics, it is essentially important to realize crystal growth that does not allow formation of abnormal structures in a nitride semiconductor layer. In order to prevent formation of abnormal structures, it is effective to provide the GaN substrate with a proper off-angle in advance to cause so-called "step flow growth" as described in the invention. Especially, as in the GaN substrate 10 shown in FIG. 1, setting an off-angle only in a single direction to cause one-directional step flow growth certainly suppresses the formation of abnormal structures. It is very difficult to quantitatively predict theoretically ideal off-angles because the crystal growth, a dynamic physicochemical phenomenon, is extremely complicated. It is therefore realistic to make researches for proper off-angles by an experimental approach as described in the preferred embodiment.

While the invention has been described in detail, the foregoing description is in all aspects illustrative and not restrictive. It is understood that numerous other modifications and variations GaN be devised without departing from the scope of the invention.

What is claimed is:

1. A semiconductor device manufacturing method comprising:
    (a) preparing a gallium nitride substrate having an upper surface with an off-angle in a range from 0.1° to 1.0° in a <1-100> direction with respect to a (0001) plane;
    (b) forming an n-type nitride semiconductor layer on and in contact with said upper surface of said gallium nitride substrate, wherein the n-type nitride semiconductor layer has an impurity concentration of not less than $1\times10^{16}$ cm$^{-3}$ and not more than $1\times10^{20}$ cm$^{-3}$; and
    between (a) and (b), applying a thermal process to said gallium nitride substrate for at least 5 minutes at a temperature in a range from 800° C. to 1200° C. in an ambient containing NH$_3$ or containing NH$_3$ and H$_2$, wherein, when the ambient containing NH$_3$ and H$_2$ is used, percentage of H$_2$ is no more than 30%.

2. The semiconductor device manufacturing method according to claim 1, including applying the thermal process for a time in a range from 5 minutes to 30 minutes.

3. The semiconductor device manufacturing method according to claim 1, wherein the thermal process is applied at a temperature from 1000° C. to 1200° C.

4. The semiconductor device manufacturing method according to claim 1, wherein, the thermal process is applied at a temperature of 1000° C. for at least 10 minutes and when the ambient containing NH$_3$ and H$_2$ is used, a percentage of H$_2$ does not exceed 10%.

5. The semiconductor device manufacturing method according to claim 1, wherein the n-type nitride semiconductor layer has an impurity concentration is not less than $1\times10^{17}$ cm$^{-3}$ and not more than $1\times10^{19}$ cm$^{-3}$.

6. The semiconductor device manufacturing method according to claim 1, wherein the n-type nitride semiconductor layer has an impurity concentration is not less than $1\times10^{17}$ cm$^{-3}$ and not more than $5\times10^{18}$ cm$^{-3}$.

* * * * *